(12) United States Patent
Cho et al.

(10) Patent No.: US 6,707,321 B2
(45) Date of Patent: Mar. 16, 2004

(54) INPUT RECEIVER FOR CONTROLLING OFFSET VOLTAGE USING OUTPUT FEEDBACK SIGNAL

(75) Inventors: Young-chan Cho, Chungcheongbuk-Do (KR); Youn-cheul Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/401,580

(22) Filed: Mar. 31, 2003

(65) Prior Publication Data

US 2003/0214341 A1 Nov. 20, 2003

(30) Foreign Application Priority Data

May 14, 2002 (KR) ............... 10-2002-0026434

(51) Int. Cl.[7] .................. G01R 19/00; G11C 7/00; H03F 3/45
(52) U.S. Cl. .................. 327/51; 327/52; 327/57
(58) Field of Search .................. 327/51, 52, 56, 327/57, 77, 81, 88, 89, 307; 365/205, 207

(56) References Cited

U.S. PATENT DOCUMENTS 6,246,620 B1 * 6/2001 Fujioka et al. .............. 365/205
6,326,815 B1 * 12/2001 Sim et al. .................... 327/57
6,590,805 B2 * 7/2003 Lu et al. ..................... 365/158

* cited by examiner

Primary Examiner—Tuan T. Lam
(74) Attorney, Agent, or Firm—Volentine Francos, PLLC

(57) ABSTRACT

An input receiver controls an offset voltage by using an output feedback signal to improve a sense speed. The input receiver includes a pre-amplifier that controls an offset voltage in response to a feedback signal and amplifies an input signal with reference to a reference voltage. A sense amplifier amplifies an output signal and an inverted output signal of the pre-amplifier in response to a clock signal. A latch circuit latches an output signal and an inverted output signal of the sense amplifier. An inversion circuit uses the reference voltage as a power supply voltage and inverts an inverted output signal of the latch circuit. In addition, an output signal of the inversion circuit is supplied as the feedback signal. Alternatively, the output signal of the latch circuit may be directly supplied to the pre-amplifier as the feedback signal while not using the inversion circuit.

28 Claims, 5 Drawing Sheets

INPUT RECEIVER FOR CONTROLLING OFFSET VOLTAGE USING OUTPUT FEEDBACK SIGNAL

CROSS REFERENCES TO RELATED APPLICATIONS

This application claims the priority under 35 U.S.C. §119 from Korean Patent Application No. 2002-26434, filed on May 14, 2002, that contents of which are hereby incorporated by reference in their entirety as if fully set forth herein.

BACKGROUND AND SUMMARY

1. Technical Field

The present invention relates to a semiconductor device, and more particularly, to an input receiver of a semiconductor device.

2. Description

Semiconductor devices include input receivers to receive input data from outside the device. Nowadays, as the operation speed of semiconductor devices increases, the sense speed, i.e., the operation speed of input receivers, has to be increased. In the field of DRAMs, in order to improve operation speed, single data rate (SDR) synchronous DRAMs and dual data rate (DDR) synchronous DRAMs that are operated at a speed of hundreds of MHz have been developed. An SDR synchronous DRAM receives an input signal in response to a rising edge of a clock signal and a DDR synchronous DRAM receives an input signal in response to a rising edge and a falling edge of a clock signal.

FIG. 1 is a circuit diagram illustrating an input receiver used in an SDR synchronous DRAM. Referring to FIG. 1, the input receiver includes a pre-amplifier 11, a sense amplifier 13, and a latch circuit 15. Here, the pre-amplifier 11 amplifies an input signal IN, from outside of the DRAM, with reference to a reference voltage VREF. The sense amplifier 13 amplifies an output signal POUT, and an inverted output signal POUTB, of the pre-amplifier 11 in response to a clock signal CLK, i.e., a rising edge of the clock signal CLK. The latch circuit 15 latches an output signal SOUT, and an inverted output signal SOUTB, of the sense amplifier 13 to output a final output signal OUT and an inverted final output signal OUTB.

FIG. 2 is a circuit diagram illustrating an input receiver used in a DDR synchronous DRAM and a RAMBUS® DRAM. Referring to FIG. 2, the input receiver includes a first pre-amplifier 11a, a first sense amplifier 13a, a first latch circuit 15a, a second pre-amplifier 11b, a second sense amplifier 13b, and a second latch circuit 15b. Since DDR synchronous DRAMs and RAMBUS® DRAMs have to receive input signals IN at a rising edge and a falling edge of a clock signal CLK, the input receiver used in the DDR synchronous DRAM and the RAMBUS® DRAM includes two pre-amplifiers 11a and 11b, two sense amplifiers 13a and 13b, and two latch circuits 15a and 15b.

The configurations of the first and second pre-amplifiers 11a and 11b are the same as that of the pre-amplifier 11 of FIG. 1, and the first and second pre-amplifiers 11a and 11b amplify an input signal IN from outside of the DRAM with reference to reference voltages VREF, respectively. The first sense amplifier 13a amplifies an output signal POUT1, and an inverted output signal POUTB1, of the first pre-amplifier 11a in response to a clock signal CLK, i.e., a rising edge of the clock signal CLK. The second sense amplifier 13b amplifies an output signal POUT2, and an inverted output signal POUTB2, of the second pre-amplifier 11b in response to an inverted clock signal CLKB, i.e., a falling edge of the clock signal CLK. The first latch circuit 15a latches an output signal SOUT1, and an inverted output signal SOUTB1, of the first sense amplifier 13a to output a final output signal OUT1 and an inverted final output signal OUTB1. The second latch circuit 15b latches an output signal SOUT2, and an inverted output signal SOUTB2, of the second sense amplifier 13b to output a final output signal OUT2 and an inverted final output signal OUTB2.

Here, the sizes of NMOS transistors N11, to which the reference voltages VREF are applied, in the pre-amplifiers 11, 11a, and 11b of the conventional input receivers of FIGS. 1 and 2 are fixed. Accordingly, a sense speed, i.e., an operating speed, is uniform regardless of the voltage level of the input signal IN.

FIG. 3 is a circuit diagram illustrating another input receiver used in a DDR synchronous DRAM and a RAMBUS® DRAM. Referring to FIG. 3, the input receiver includes a first pre-amplifier 31a, a first sense amplifier 33a, a first latch circuit 35a, a second pre-amplifier 31b, a second sense amplifier 33b, and a second latch circuit 35b. An output signal OUT2 of the second latch circuit 35b is fed back and applied to the gate of an NMOS transistor N31 in the first pre-amplifier 31a, and an output signal OUT1 of the first latch circuit 35a is fed back and applied to the gate of an NMOS transistor (not shown) in the second pre-amplifier 31b.

However, when the input signal IN, the output signal OUT2 of the second latch circuit 35b, and the data OUT1 stored in the first latch 35a have the logical values of 1, 1, and 0, respectively, a sense speed, i.e., an operating speed, is lowered in the input receiver of FIG. 3.

To solve the above-described problems, it would be desirable to provide an input receiver with an improved sense speed.

In one aspect of the invention, an input receiver includes a pre-amplifier adapted to control an offset voltage in response to a feedback signal and adapted to amplify an input signal with reference to a reference voltage. A sense amplifier amplifies an output signal and an inverted output signal of the pre-amplifier in response to a clock signal. A latch circuit latches an output signal and an inverted output signal of the sense amplifier. An inversion circuit uses the reference voltage as a power supply voltage and inverts an inverted output signal of the latch circuit. In addition, an output signal of the inversion circuit is supplied as the feedback signal.

Alternatively, the output signal of the latch circuit may be directly supplied to the pre-amplifier as the feedback signal while not using the inversion circuit.

The pre-amplifier includes a first load transistor, a second load transistor, and first through third transistors. Here, the first load transistor is connected between a first reference voltage and an inversion output terminal outputting the inverted output signal in the pre-amplifier. The second load transistor is connected between the first reference voltage and an output terminal outputting the output signal in the pre-amplifier. While the gate of the first transistor receives the input signal, the first transistor is connected between the inversion output terminal and a common node. While the gate of the second transistor receives the reference voltage, the second transistor is connected between the output terminal and the common node. While the gate of the third transistor receives the feedback signal, the third transistor is connected between the output terminal and the common node. Here, the sizes of the first through third transistors are different from each other.

The common node is connected to a second reference voltage or the pre-amplifier further includes a fourth transistor connected between the common node and the second reference voltage while a gate receives an enable signal.

In another aspect of the invention, an input receiver includes a first pre-amplifier adapted to control an offset voltage in response to a first feedback signal and adapted to amplify an input signal with reference to a reference voltage, and a second pre-amplifier adapted to control an offset voltage in response to a second feedback signal and adapted to amplify the input signal with reference to the reference voltage.

A first sense amplifier amplifies an output signal and an inverted output signal of the first pre-amplifier in response to a clock signal. A first latch circuit latches an output signal and an inverted output signal of the first sense amplifier. A first inversion circuit uses the reference voltage as a power supply voltage and inverts an inverted output signal of the first latch circuit. Here, the output signal of the first inversion circuit is supplied as the first feedback signal. A second sense amplifier amplifies an output signal and an inverted output signal of the second pre-amplifier in response to an inverted clock signal. A second latch circuit latches an output signal and an inverted output signal of the second sense amplifier. A second inversion circuit uses the reference voltage as a power supply voltage and inverts an inverted output signal of the second latch circuit.

Alternatively, the output signal of the first latch circuit may be supplied to the first pre-amplifier as the first feedback signal while not using the first inversion, circuit and the output signal of the second latch circuit may be supplied to the second pre-amplifier as the second feedback signal while not using the second inversion circuit.

Beneficially, the constitutions of the first and second pre-amplifiers are the same as that of the pre-amplifier of the first embodiment. The constitutions of the first and second sense amplifiers are the same as that of the sense amplifier of the first embodiment. The constitutions of the first and second latch circuits are the same as that of the latch circuit of the first embodiment.

BRIEF DESCRIPTION OF THE DRAWINGS

The above objective and advantages of the present invention will become more apparent by describing in detail preferred embodiments thereof with reference to the attached drawings in which.

DETAILED DESCRIPTION

Figure 1:
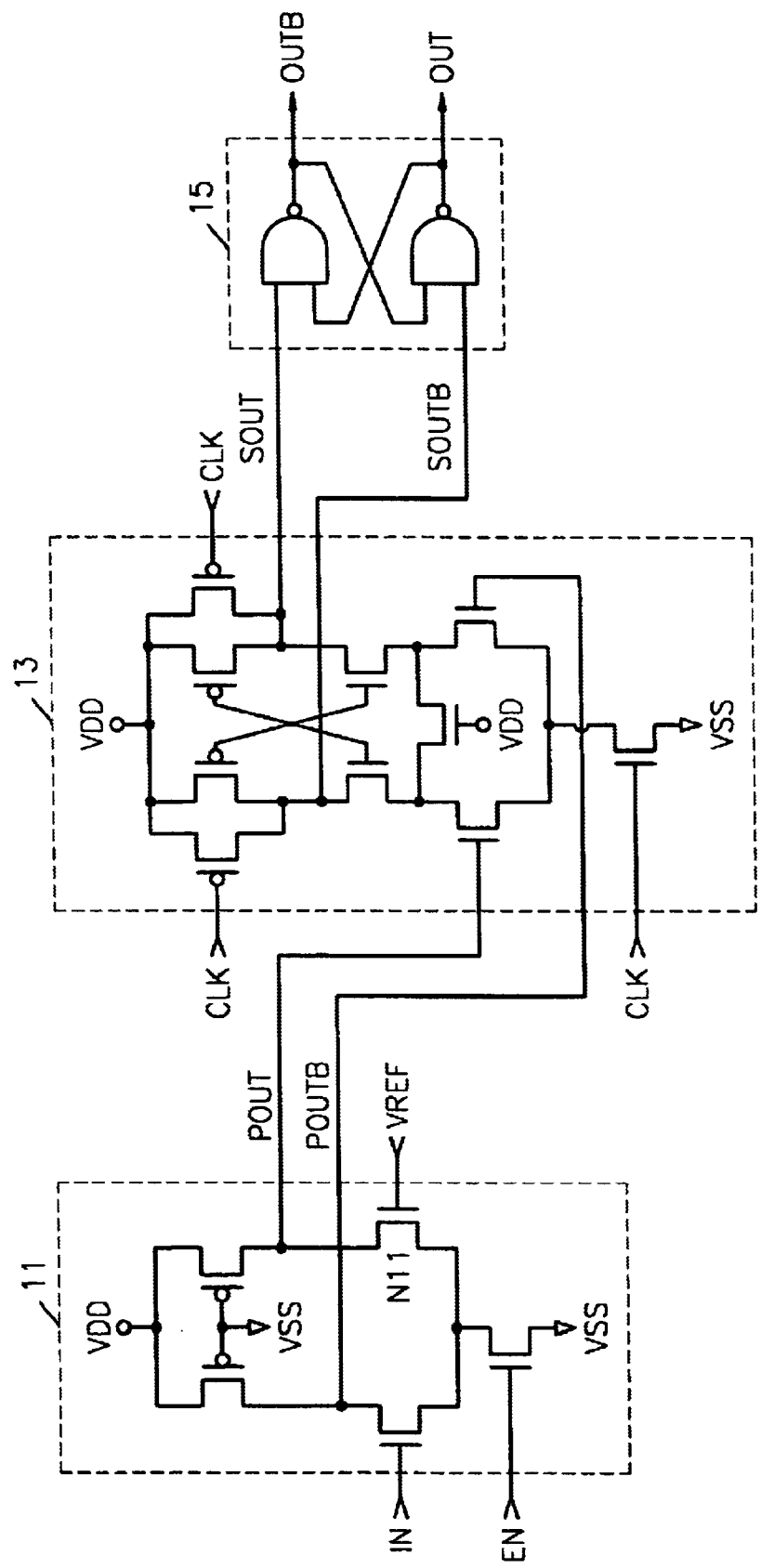
FIG. 1 is a circuit diagram illustrating an input receiver used in a single data rate (SDR) synchronous DRAM.
Figure 2:
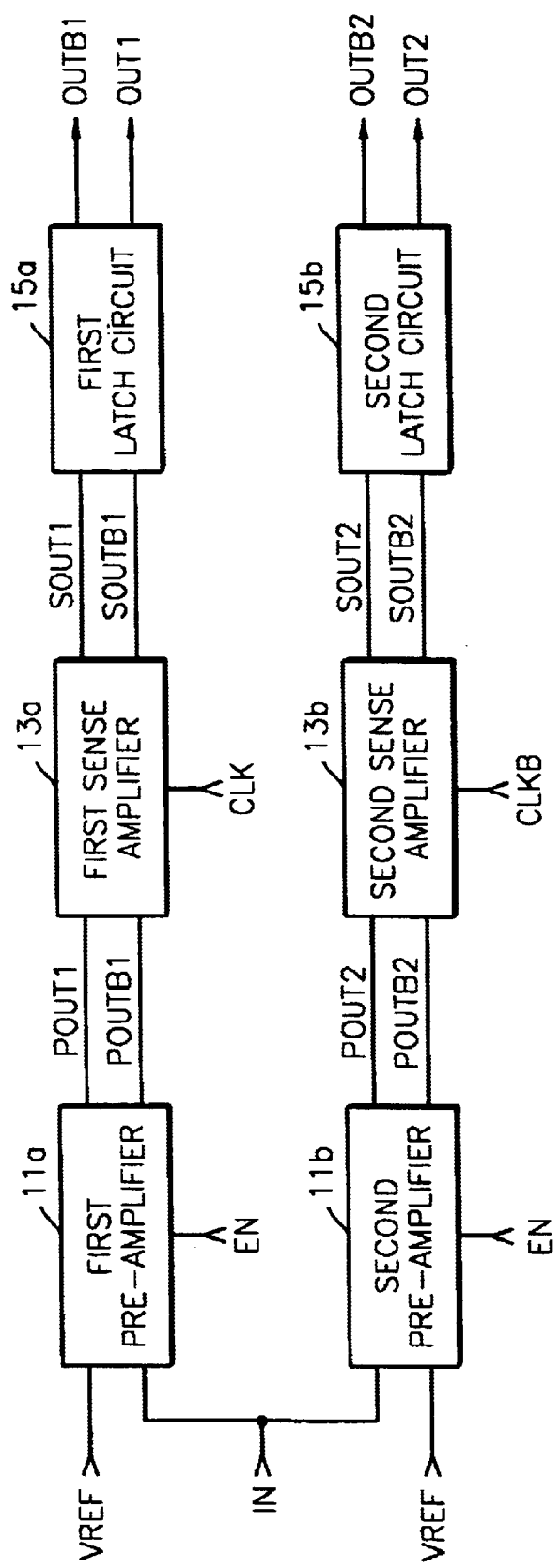
FIG. 2 is a circuit diagram illustrating an input receiver used in a double data rate (DDR) synchronous DRAM and a RAMBUS® DRAM.
Figure 3:
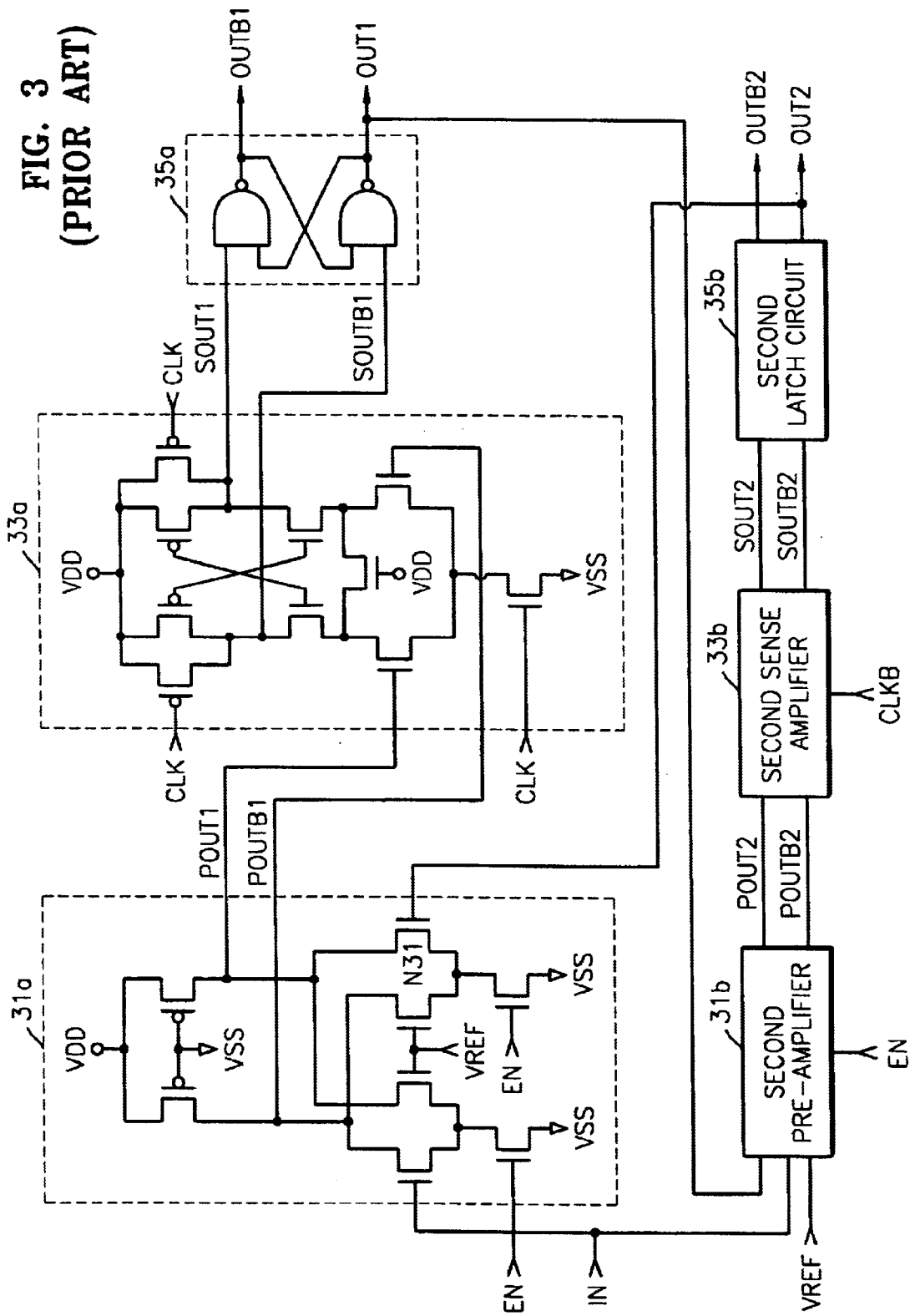
FIG. 3 is a circuit diagram illustrating another input receiver used in a DDR synchronous DRAM and a RAMBUS® DRAM.

The present invention will now be described more fully with reference to the accompanying drawings, in which preferred embodiments of the invention are shown. The same reference numerals in different drawings represent the same elements, and thus their description will not be repeated.

Figure 4:
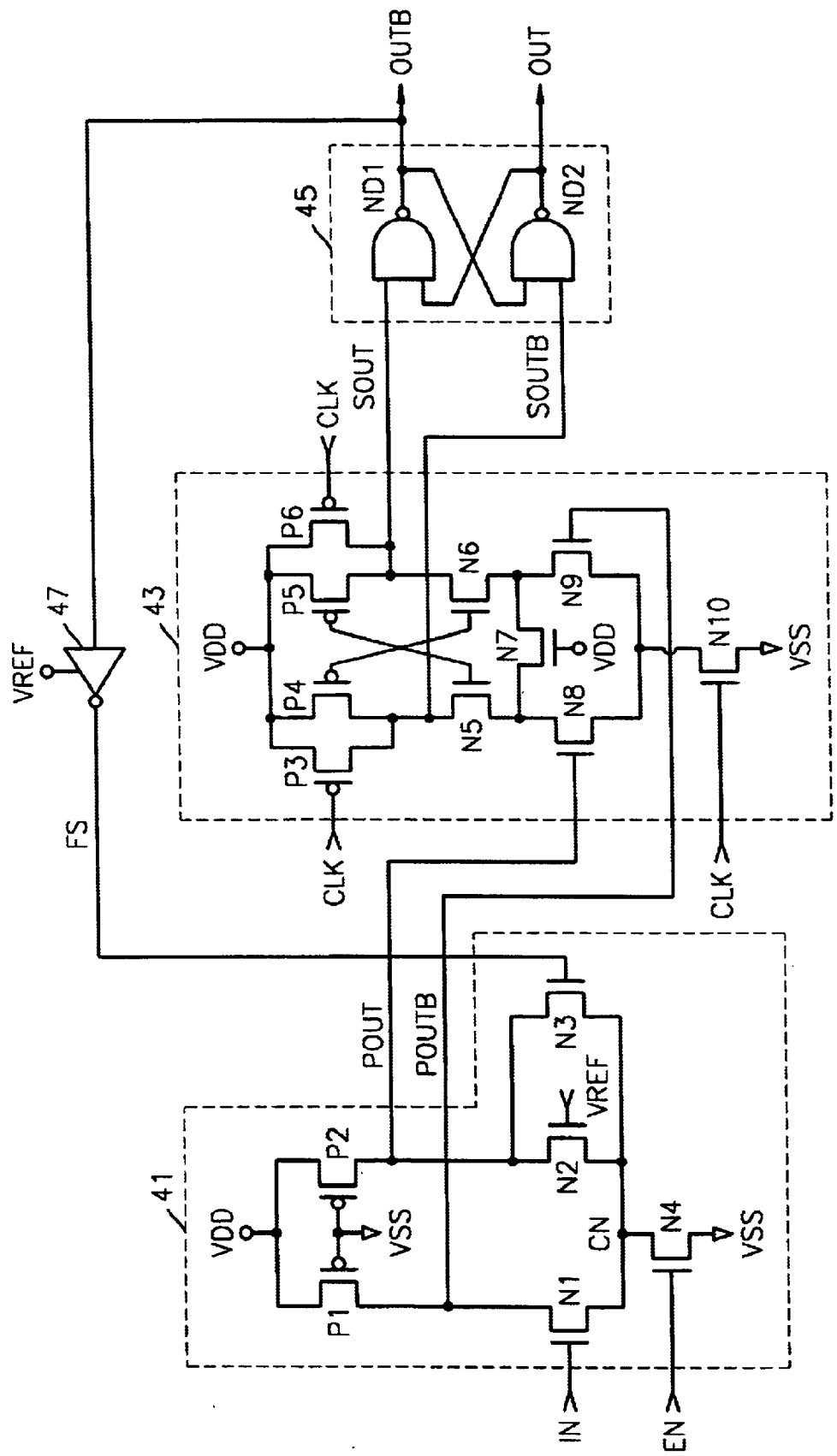
FIG. 4 is a circuit diagram illustrating an input receiver used in an SDR synchronous DRAM according to a first embodiment.

FIG. 4 is a circuit diagram illustrating an input receiver used in a single data rate (SDR) synchronous DRAM according to a first embodiment.

Referring to FIG. 4, an input receiver according to the first embodiment includes a pre-amplifier 41, a sense amplifier 43, a latch circuit 45, and an inversion circuit 47.

The pre-amplifier 41 controls an offset voltage in response to a feedback signal FS and amplifies an input signal IN with reference to a reference voltage VREF. The sense amplifier 43 amplifies an output signal POUT and an inverted output signal POUTB of the pre-amplifier 41 in response to a clock signal CLK, i.e., a rising edge of the clock signal CLK. The latch circuit 45 latches an output signal SOUT and an inverted output signal SOUTB of the sense amplifier 43 to output a final output signal OUT and an inverted final output signal OUTB. The inversion circuit 47 uses the reference voltage VREF as a power supply voltage and inverts the inverted final output signal OUTB of the latch circuit 45. Here, an output signal of the inversion circuit 47 is supplied to the pre-amplifier 41 as the feedback signal FS.

The inversion circuit 47 uses the reference voltage VREF as the power supply voltage to prevent the voltage swing of the feedback signal FS from excessively increasing. However, when necessary, the output signal OUT of the latch circuit 45 can be directly supplied to the pre-amplifier 41 as a feedback signal without using the inversion circuit 47.

The pre-amplifier 41 is formed in a differential amplifier type while including first and second PMOS load transistors P1 and P2 and first through third NMOS transistors N1, N2, and N3. The pre-amplifier 41 may further include a fourth NMOS transistor N4 when needed. The first PMOS load transistor P1 is connected between an inversion output terminal of the pre-amplifier 41 that outputs an inverted output signal POUTB and a first reference voltage, i.e., a first power supply voltage VDD. The second PMOS load transistor P2 is connected between an output terminal of the pre-amplifier 41 that outputs an output signal POUT and the power supply voltage VDD. The first NMOS transistor N1 is connected between the inversion output terminal and a common node CN while the gate receives the input signal IN. The second NMOS transistor N2 is connected between the output terminal and the common node CN while the gate receives the reference voltage VREF. The third NMOS transistor N3 is connected between the output terminal and the common node CN while the gate receives the feedback signal FS.

The common node CN may be directly connected to a second power supply voltage or second reference voltage, i.e., the ground voltage VSS. In addition, when necessary, the pre-amplifier 41 may include the fourth NMOS transistor N4 connected between the common node CN and the ground voltage VSS while the gate receives an enable signal EN. In this case, the pre-amplifier 41 is activated in response to the enable signal EN.

Here, the sizes of the first through third NMOS transistors N1, N2, and N3 are designed to be different from each other. Therefore, an offset voltage can be generated and the offset voltage can be controlled by the third NMOS transistor that receives the feedback signal FS so that a sense speed can be improved.

When the input signal IN has a logical value of 0, if a previous input signal had a logical value of 1, i.e., the output signal OUT of the latch circuit 45 has a logical value of 1, than the feedback signal FS goes to a logical value of 1 so that the third NMOS transistor N3 is activated. Therefore, the offset voltage increases to improve the sense speed. When the input signal IN has a logical value of 1, if the previous input signal had a logical value of 0, i.e., then the output signal OUT of the latch circuit 45 has a logical value of 0, the feedback signal FS goes to a logical value of 0 so that the third NMOS transistor N3 is inactivated. Therefore, the offset voltage decreases to improve the sense speed. If the previous input signal had a logical value of 0 when the present input signal IN has a logical value of 0, or if the previous input signal had a logical value of 1 when the present input signal IN has a logical value of 1, then the data stored in the latch circuit 45 is not changed so that the sense speed is also not changed.

The sense amplifier 43 is formed of PMOS transistors P3 through P6 and NMOS transistors N5 through N10, and the latch circuit 45 is formed of NAND gates ND1 and ND2. Here, the sense amplifier 43 and the latch circuit 45 can be implemented in a variety of ways, so a description thereof will be omitted.

Figure 5:
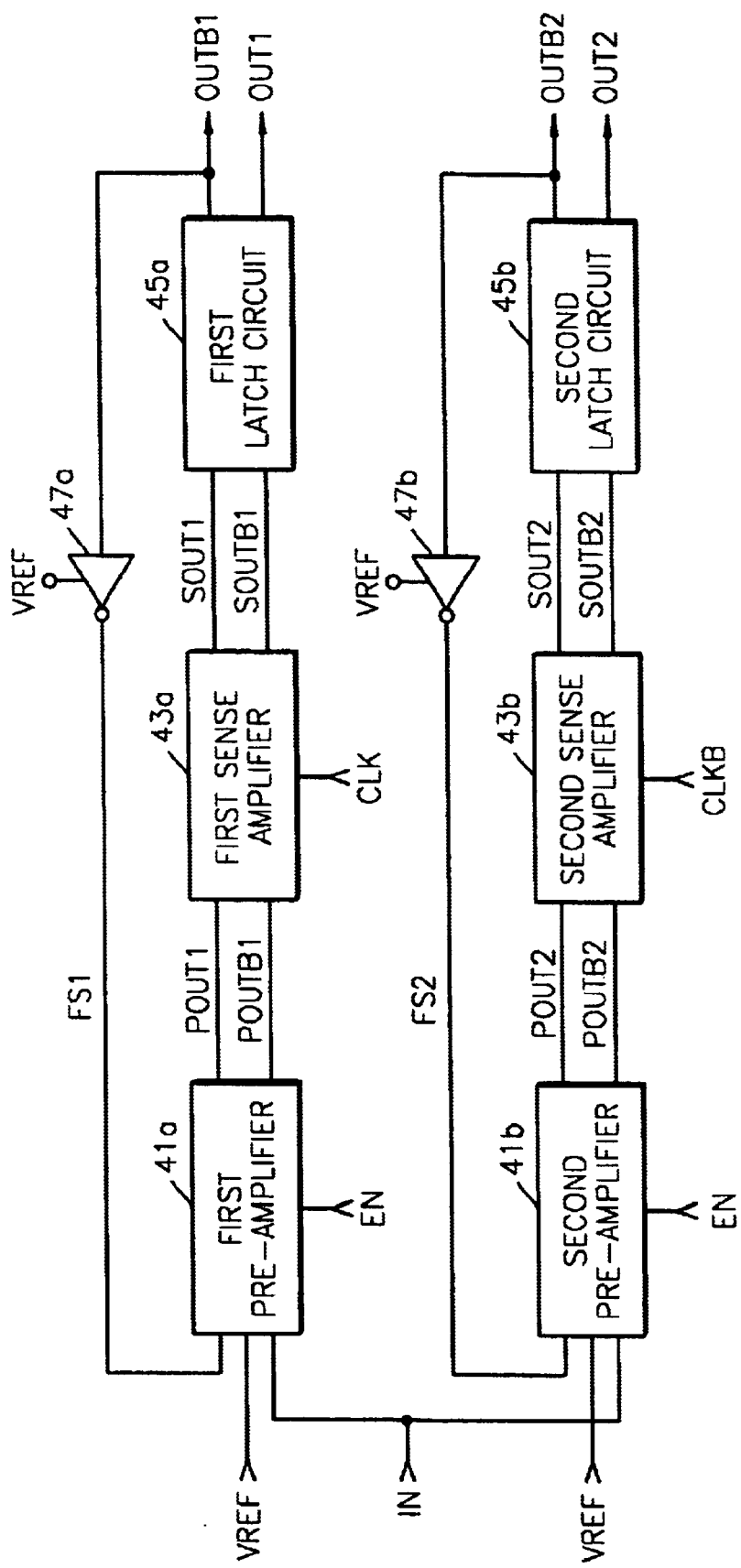
FIG. 5 is a circuit diagram illustrating an input receiver used in a DDR synchronous DRAM and a RAMBUS® DRAM according to a second embodiment.

FIG. 5 is a circuit diagram illustrating an input receiver used in a double data rate (DDR) synchronous DRAM and a RAMBUS® DRAM according to a second embodiment.

Referring to FIG. 5, an input receiver according to the second embodiment includes a first pre-amplifier 41a, a first sense amplifier 43a, a first latch circuit 45a, a first inversion circuit 47a, a second pre-amplifier 41b, a second sense amplifier 43b, a second latch circuit 45b, and a second inversion circuit 47b. Since a DDR synchronous DRAM and a RAMBUS® DRAM have to receive input signals IN at a rising edge and a falling edge of a clock signal CLK, an input receiver in the DDR synchronous DRAM and the RAMBUS® DRAM includes two pre-amplifiers 41a and 41b, two sense amplifiers 43a and 43b, two latch circuits 45a and 45b, and two inversion circuits 47a and 47b.

The configurations of the first and second pre-amplifiers 41a and 41b are the same as that of the pre-amplifier 41 of FIG. 4, and the configurations of the first and second sense amplifiers 43a and 43b are the same as that of the sense amplifier 43 of FIG. 4. The configurations of the first and second latch circuits 45a and 45b are the same as that of the latch circuit 45 of FIG. 4.

The first pre-amplifier 41a controls an offset voltage in response to a first feedback signal FS1 and amplifies an input signal IN with reference to a reference voltage VREF. The first sense amplifier 43a amplifies an output signal POUT1 and an inverted output signal POUTB1 of the first pre-amplifier 41a in response to a clock signal CLK, i.e., a rising edge of the clock signal CLK. The first latch circuit 45a latches an output signal SOUT1 and an inverted output signal SOUTB1 of the first sense amplifier 43a to output a final output signal OUT1 and an inverted final output signal OUTB1. The first inversion circuit 47a uses the reference voltage VREF as a power supply voltage and inverts the inverted output signal OUTB1 of the first latch circuit 45a. In addition, an output signal of the first inversion circuit 47a is supplied to the first pre-amplifier 41a as the first feedback signal FS1.

The second pre-amplifier 41b controls an offset voltage in response to a second feedback signal FS2 and amplifies an input signal IN with reference to the reference voltage VREF. The second sense amplifier 43b amplifies an output signal POUT2 and an inverted output signal POUTB2 of the second pre-amplifier 41b in response to an inverted clock signal CLKB, i.e., a falling edge of the clock signal CLK. The second latch circuit 45b latches an output signal SOUT2 and an inverted output signal SOUTB2 of the second sense amplifier 43b to output a final output signal OUT2 and an inverted final output signal OUTB2. The second inversion circuit 47b uses the reference voltage VREF as a power supply voltage and inverts the inverted final output signal OUTB2 of the second latch circuit 45b. In addition, an output signal of the second inversion circuit 47b is supplied to the second pre-amplifier 41b as the second feedback signal FS2.

The first and second inversion circuits 47a and 47b use the reference voltage VREF as the power supply voltage to prevent the swing widths of the first and second feedback signals FS1 and FS2 from excessively increasing as described in the first embodiment. However, when necessary, the output signal OUT1 of the first latch circuit 45a can be directly supplied to the first pre-amplifier 41a as a feedback signal without using the first inversion circuit 47a. In addition, the output signal OUT2 of the second latch circuit 45b can be directly supplied to the second pre-amplifier 41b as a feedback signal without using the second inversion circuit 47b.

NMOS transistors in the first and second pre-amplifiers 41a and 41b are designed to have different sizes from each other. Accordingly, a sense speed can be improved as described with reference to the first embodiment.

As a result, an input receiver has an advantage of increasing a sense speed, i.e., an operation speed.

While this invention has been particularly shown and described with reference to preferred embodiments thereof, the preferred embodiments described above are merely illustrative and are not intended to limit the scope of the invention. It will be understood by those skilled in the art that various changes in form and details may be made therein without departing from the spirit and scope of the invention as defined by the appended claims.

What is claimed is:

1. An input receiver comprising:
    a pre-amplifier operable to control an offset voltage in response to a feedback signal and operable to amplify an input signal with reference to a reference voltage;
    a sense amplifier operable to amplify an output signal and an inverted output signal of the pre-amplifier in response to a clock signal;
    a latch circuit operable to latch an output signal and an inverted output signal of the sense amplifier; and
    an inversion circuit operable to use the reference voltage as a power supply voltage and operable to invert an inverted output signal of the latch circuit,
    wherein an output signal of the inversion circuit is supplied as the feedback signal.

2. The input receiver of claim 1, wherein the pre-amplifier includes:
    a first load transistor connected between a first supply voltage and an inversion output terminal operable to output the inverted output signal in the pre-amplifier;
    a second load transistor connected between the first supply voltage and an output terminal operable to output the output signal in the pre-amplifier;
    a first transistor connected between the inversion output terminal and a common node while a gate thereof receives the input signal;
    a second transistor connected between the output terminal and the common node while a gate thereof receives the reference voltage; and a third transistor connected between the output terminal and the common node while a gate thereof receives the feedback signal, wherein sizes of the first through third transistors are different from each other.

3. The input receiver of claim 2, wherein the common node is connected to a second supply voltage, or the pre-amplifier further includes a fourth transistor connected between the common node and the second supply voltage while a gate thereof receives an enable signal.

4. The input receiver of claim 3, wherein the first and second load transistors are PMOS transistors.

5. The input receiver of claim 3, wherein the first through fourth transistors are NMOS transistors.

6. An input receiver comprising:
   a pre-amplifier operable to control an offset voltage in response to a feedback signal and amplifying an input signal with reference to a reference voltage;
   a sense amplifier operable to amplify an output signal and an inverted output signal of the pre-amplifier in response to a clock signal; and
   a latch circuit operable to latch an output signal and an inverted output signal of the sense amplifier,
   wherein an output signal of the latch circuit is supplied as the feedback signal.

7. The input receiver of claim 6, wherein the pre-amplifier includes:
   a first load transistor connected between a first supply voltage and an inversion output terminal operable to output the inverted output signal in the pre-amplifier;
   a second load transistor connected between the first supply voltage and an output terminal operable to output the output signal in the pre-amplifier;
   a first transistor connected between the inversion output terminal and a common node while a gate thereof receives the input signal;
   a second transistor connected between the output terminal and the common node while a gate thereof receives the reference voltage; and
   a third transistor connected between the output terminal and the common node while a gate thereof receives the feedback signal,
   wherein the sizes of the first through third transistors are different from each other.

8. The input receiver of claim 7, wherein the common node is connected to a second supply voltage, or the pre-amplifier further includes a fourth transistor connected between the common node and the second supply voltage while a, gate thereof receives an enable signal.

9. The input receiver of claim 8, wherein the first and second load transistors are PMOS transistors.

10. The input receiver of claim 8, wherein the first through fourth transistors are NMOS transistors.

11. An input receiver comprising:
    a first pre-amplifier operable to control an offset voltage in response to a first feedback signal and operable to amplify an input signal with reference to a reference voltage;
    a first sense amplifier operable to amplify an output signal and an inverted output signal of the first pre-amplifier in response to a clock signal;
    a first latch circuit operable to latch an output signal and an inverted output signal of the first sense amplifier;
    a first inversion circuit operable to use the reference voltage as a power supply voltage and operable to invert an inverted output signal of the first latch circuit;
    a second pre-amplifier operable to control an offset voltage in response to a second feedback signal and operable to amplify the input signal with reference to the reference voltage;
    a second sense amplifier operable to amplify an output signal and an inverted output signal of the second pre-amplifier in response to an inverted clock signal;
    a second latch circuit operable to latch an output signal and an inverted output signal of the second sense amplifier; and
    a second inversion circuit operable to use the reference voltage as a power supply voltage and operable to invert an inverted output signal of the second latch circuit,
    wherein an output signal of the first inversion circuit is supplied as the first feedback signal and an output signal of the second inversion circuit is supplied as the second feedback signal.

12. The input receiver of claim 11, wherein the first pre-amplifier includes:
    a first load transistor connected between a first supply voltage and an inversion output terminal operable to output the inverted output signal in the first pre-amplifier;
    a second load transistor connected between the first supply voltage and an output terminal operable to output the output signal in the first pre-amplifier;
    a first transistor connected between the inversion output terminal and a common node while a gate thereof receives the input signal;
    a second transistor connected between the output terminal and the common node while a gate thereof receives the reference voltage; and
    a third transistor connected between the output terminal and the common node while a gate thereof receives the first feedback signal,
    wherein the sizes of the first through third transistors are different from each other.

13. The input receiver of claim 12, wherein the common node is connected to a second supply voltage or the first pre-amplifier further includes a fourth transistor connected between the common node and the second supply voltage while a gate receives an enable signal.

14. The input receiver of claim 13, wherein the first and second load transistors are PMOS transistors.

15. The input receiver of claim 13, wherein the first through fourth transistors are NMOS transistors.

16. The input receiver of claim 11, wherein the second pre-amplifier includes:
    a first load transistor connected between a first supply voltage and an inversion output terminal adapted to output the inverted output signal in the second pre-amplifier;
    a second load transistor connected between the first supply voltage and an output terminal operable to output the output signal in the second pre-amplifier;
    a first transistor connected between the inversion output terminal and a common node while a gate thereof receives the input signal;
    a second transistor connected between the output terminal and the common node while a gate thereof receives the reference voltage; and
    a third transistor connected between the output terminal and the common node while a gate thereof receives the second feedback signal, wherein the sizes of the first through third transistors are different from each other.

17. The input receiver of claim 16, wherein the common node is connected to a second supply voltage, or the second pre-amplifier further includes a fourth transistor connected between the common node and the second supply voltage while a gate thereof receives an enable signal.

18. The input receiver of claim 17, wherein the first and second load transistors are PMOS transistors.

19. The input receiver of claim 17, wherein the first through fourth transistors are NMOS transistors.

20. An input receiver comprising:
   a first pre-amplifier operable to control an offset voltage in response to a first feedback signal and operable to amplify an input signal with reference to a reference voltage;
   a first sense amplifier operable to amplify an output signal and an inverted output signal of the first pre-amplifier in response to a clock signal;
   a first latch circuit operable to latch an output signal and an inverted output signal of the first sense amplifier;
   a second pre-amplifier operable to control an offset voltage in response to a second feedback signal and operable to amplify the input signal with reference to the reference voltage;
   a second sense amplifier operable to amplify an output signal and an inverted output signal of the second pre-amplifier in response to an inverted clock signal; and
   a second latch circuit adapted to latch an output signal and an inverted output signal of the second sense amplifier,
   wherein an output signal of the first latch circuit is supplied as the first feedback signal and an output signal of the second latch circuit is supplied as the second feedback signal.

21. The input receiver of claim 20, wherein the first pre-amplifier includes:
   a first load transistor connected between a first supply voltage and an inversion output terminal operable to output the inverted output signal in the first pre-amplifier;
   a second load transistor connected between the first supply voltage and an output terminal operable to output the output signal in the first pre-amplifier;
   a first transistor connected between the inversion output terminal and a common node while a gate thereof receives the input signal;
   a second transistor connected between the output terminal and the common node while a gate thereof receives the reference voltage; and
   a third transistor connected between the output terminal and the common node while a gate thereof receives the first feedback signal,
   wherein the sizes of the first through third transistors are different from each other.

22. The input receiver of claim 21, wherein the common node is connected to a second supply voltage, or the first pre-amplifier further includes a fourth transistor connected between the common node and the second supply voltage while a gate thereof receives an enable signal.

23. The input receiver of claim 22, wherein the first and second load transistors are PMOS transistors.

24. The input receiver of claim 22, wherein the first through fourth transistors are NMOS transistors.

25. The input receiver of claim 20, wherein the second pre-amplifier includes:
   a first load transistor connected between a first supply voltage and an inversion output terminal operable to output the inverted output signal in the second pre-amplifier;
   a second load transistor connected between the first supply voltage and an output terminal operable to output the output signal in the second pre-amplifier;
   a first transistor connected between the inversion output terminal and a common node while a gate thereof receives the input signal;
   a second transistor connected between the output terminal and the common node while a gate thereof receives the reference voltage; and
   a third transistor connected between the output terminal and the common node while a gate thereof receives the second feedback signal,
   wherein the sizes of the first through third transistors are different from each other.

26. The input receiver of claim 25, wherein the common node is connected to a second supply voltage, or the second pre-amplifier further includes a fourth transistor connected between the common node and the second supply voltage while a gate thereof receives an enable signal.

27. The input receiver of claim 26, wherein the first and second load transistors are PMOS transistors.

28. The input receiver of claim 26, wherein the first through fourth transistors are NMOS transistors.

* * * * *